(12) United States Patent
Chevallier

(10) Patent No.: US 6,222,417 B1
(45) Date of Patent: *Apr. 24, 2001

(54) AMPLIFIER OUTPUT STAGE PROVIDED WITH A PARASITIC-CURRENT LIMITER

(75) Inventor: Gilles Chevallier, Langrune/Mer (FR)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/301,934

(22) Filed: Apr. 29, 1999

(30) Foreign Application Priority Data

Apr. 30, 1998 (FR) .................................................. 98 05470

(51) Int. Cl.[7] ........................................................ H03F 3/26
(52) U.S. Cl. ............................................ 330/262; 330/273
(58) Field of Search ...................................... 330/262, 270, 330/273

(56) References Cited

U.S. PATENT DOCUMENTS

| | | | |
|---|---|---|---|
| 3,555,442 | * 1/1971 | Gardner | 330/15 |
| 4,853,645 | * 8/1989 | Seevinck et al. | 330/255 |
| 5,142,245 | * 8/1992 | Barbu | 330/255 |
| 5,545,918 | 8/1996 | Dos Santos et al. | 257/577 |
| 5,825,247 | * 10/1998 | Herrlinger | 330/265 |

FOREIGN PATENT DOCUMENTS 56-56014A  5/1981  (JP) .

OTHER PUBLICATIONS

A 1–GHZ BICMOS RF Front–End IC, Mar. 1994.*

* cited by examiner

Primary Examiner—Robert Pascal
Assistant Examiner—Henry Choe
(74) Attorney, Agent, or Firm—Steven R. Biren

(57) ABSTRACT

An output stage for an amplifier AMP includes a first transistor T1 and a second transistor T2 having their main current paths arranged between two power supply terminals VCC and GND, the bias terminal of the first transistor T1 being connected to the output of the amplifier AMP and the bias terminal of the second transistor T2 being connected to the input of the amplifier AMP via a bias circuit BC. The bias circuit includes a detection module intended to signal the instant when the second transistor T2 enters the state of saturation, and an impedance matching module intended, when activated, to attribute a high impedance to the bias terminal of the second transistor T2 when the transistor becomes saturated. The circuit limits the value of a parasitic current injected into the substrate via a parasitic transistor PT2 which appears when the second transistor T2 is saturated.

5 Claims, 2 Drawing Sheets

AMPLIFIER OUTPUT STAGE PROVIDED WITH A PARASITIC-CURRENT LIMITER

BACKGROUND OF THE INVENTION

The present invention relates to an amplifier output stage comprising a first and a second transistor each provided with a bias terminal, a reference terminal and a transfer terminal, said transistors having their principal current paths arranged between a first and a second power supply terminal, a junction point between said current paths constituting an output terminal of the stage, the bias terminal of the first transistor being connected to an output of the amplifier, the bias terminal of the second transistor being connected to an input of the amplifier via a bias circuit.

Such output stages are commonly used in integrated circuits. They have the advantage of realizing an amplification of a signal present at the output of the amplifier at the expense of a low energy dissipation. The known output circuit has, however, a major drawback, which appears when the second transistor is in the saturated state. In this state, the second transistor features a parasitic transistor of a conductivity type which is opposed to that of the second transistor, the bias terminal, the reference terminal and the transfer terminal of the parasitic transistor being constituted by the transfer terminal, the bias terminal and the substrate, respectively, of the second transistor. When the second transistor is saturated, it receives a bias current at its bias terminal which is directed to the substrate via the main current path of the parasitic transistor. If the bias terminal of the second transistor has a low impedance, nothing limits the bias current value, which is precisely the case for the known output stages, in which the bias terminal of the second transistor is connected to the input of the amplifier whose equivalent impedance is necessarily low. This connection is realized either directly or via a bias circuit which may comprise a diode connected to a power supply terminal via the main current path of a transistor whose bias terminal is connected to the input of the amplifier, but the bias circuit does not in any case have a sufficient impedance to limit the bias current of the second transistor. The value of said bias current thus is not limited, because of the low impedance of the bias terminal of the second transistor, with the result that a strong parasitic current is injected into the substrate at the risk of disturbing the operation of all components present in the integrated circuit on the surface of the substrate, and may even damage this circuit. Moreover, when the second transistor leaves its saturated state so as to resume a linear operation mode under the effect of an increase of the potential at the output terminal of the stage, a necessary evacuation of the important amount of electric charge accumulated in the base of the second transistor generates a current pulse in the collector of said transistor, as the parasitic transistor has disappeared. Now, the power supply terminals of the integrated circuit are connected by means of wires to pins present on a protection housing incorporating the integrated circuit, which pins provide the electric connections between the integrated circuit and components outside the housing. These wires have an intrinsic inductance which, when subjected to a current pulse, generates a voltage peak of a very high value which may have destructive effects, or at least disturb the potential of the power supply terminals and thereby the operation of the whole integrated circuit.

SUMMARY OF THE INVENTION

It is an object of the present invention to remedy these drawbacks by proposing an output stage in which the value of the bias current of the second transistor is controlled when said transistor is in the saturated state, the control thus effected being inoperative when the second transistor is in the linear operating state.

According to the invention, an output stage as described in the opening paragraph is therefore characterized in that the bias circuit comprises:

a detection module intended to signal the instant when the second transistor enters the state of saturation, and an impedance adaptation module intended, when activated, to attribute a high impedance to the bias terminal of the second transistor when said transistor becomes saturated.

In this output stage, the saturation of the second transistor causes a considerable increase of the impedance of its bias terminal. The presence of this strong impedance allows limitation of the bias current value until the second transistor resumes its linear operation mode.

In a particular embodiment of the invention, an output stage as described above is characterized in that the detection module is provided with means for producing a detection current at an output when the value of the current at the bias terminal of the second transistor exceeds a predetermined threshold, said detection current being intended to activate the impedance matching module.

In this embodiment, the information signaling the instant when the second transistor becomes saturated is materialized in the form of a current, which can be easily exploited. As will be explained hereinafter, this embodiment allows the use of simple and thus less costly structures for the impedance adaptation and detection modules.

In a particular embodiment of the invention, the impedance adaptation module comprises a third transistor, whose bias terminal is connected to the input of the amplifier via a resistor, and whose main current path is arranged in series with a first current source between the first and second power supply terminals, the reference terminal of the third transistor being connected to the bias terminal of the second transistor via the detection module, the bias terminal of the third transistor being further connected to the output of the detection module via a diode.

In this embodiment, which is advantageous by virtue of its simplicity, the sole presence of a detection current renders the diode conducting, thus activating the impedance matching module, which enables the limitation of the bias current of the second transistor.

In a preferred embodiment of the invention, the detection module comprises a fourth transistor, whose bias terminal is connected to the reference terminal of the third transistor, and whose transfer and reference terminals are connected to the first and second power supply terminals via second and third current sources, respectively, the transfer terminal of the fourth transistor constituting the output of the detection module, the reference terminal of said transistor being connected to the bias terminal of the second transistor.

This structure enables to adjust, in a simple and cheap manner, the threshold value above which the bias current will be considered to be representative of the instant when the second transistor becomes saturated. Indeed, when the value of said bias current exceeds the value of the difference between the values of the currents supplied by the second and third current sources, the output of the detection module will produce a negative detection current, i.e. it will pull from the outside a current whose value will be substantially equal to the difference between the bias current of the second transistor and the value of the current supplied by the second current source.

If the present invention may be used in all types of devices requiring amplification, its implementation is particularly advantageous in devices for selecting radio electric signals, often used in television receivers or radio telephone apparatuses. The invention thus also relates to a device for selecting radio electric signals, comprising:

an antenna and filtering system intended to supply, at an output, an electronic signal having a radio frequency and being representative of the selected radio electric signal, an oscillator intended to supply an output signal having a tunable oscillation frequency, a mixer intended to receive the output signals from the oscillator and the antenna and filtering system, and to supply an output signal having an intermediate frequency equal to the difference between the radio frequency and the oscillation frequency, and an amplifier intended to amplify the output signal of the mixer, in which device the amplifier is provided with an output stage as described hereinbefore.

The output stage according to the invention prevents strong parasitic currents having the intermediate frequency from propagating in the substrate, which could alter the oscillation frequency and thus degrade the precision of selection performed by the device. Moreover, such a parasitic current would be the cause of a frequency shift likely to disturb the processing of the signal supplied by the selection device. Such degradations would ultimately be perceived by the user of the apparatus incorporating the selection device and would be a nuisance which should be minimized as much as possible, which is obtained in the present invention.

These and other aspects of the invention will be apparent from and elucidated with reference to the embodiments described hereinafter.

DESCRIPTION OF THE PREFERRED EMBODIMENTS

Figure 1:
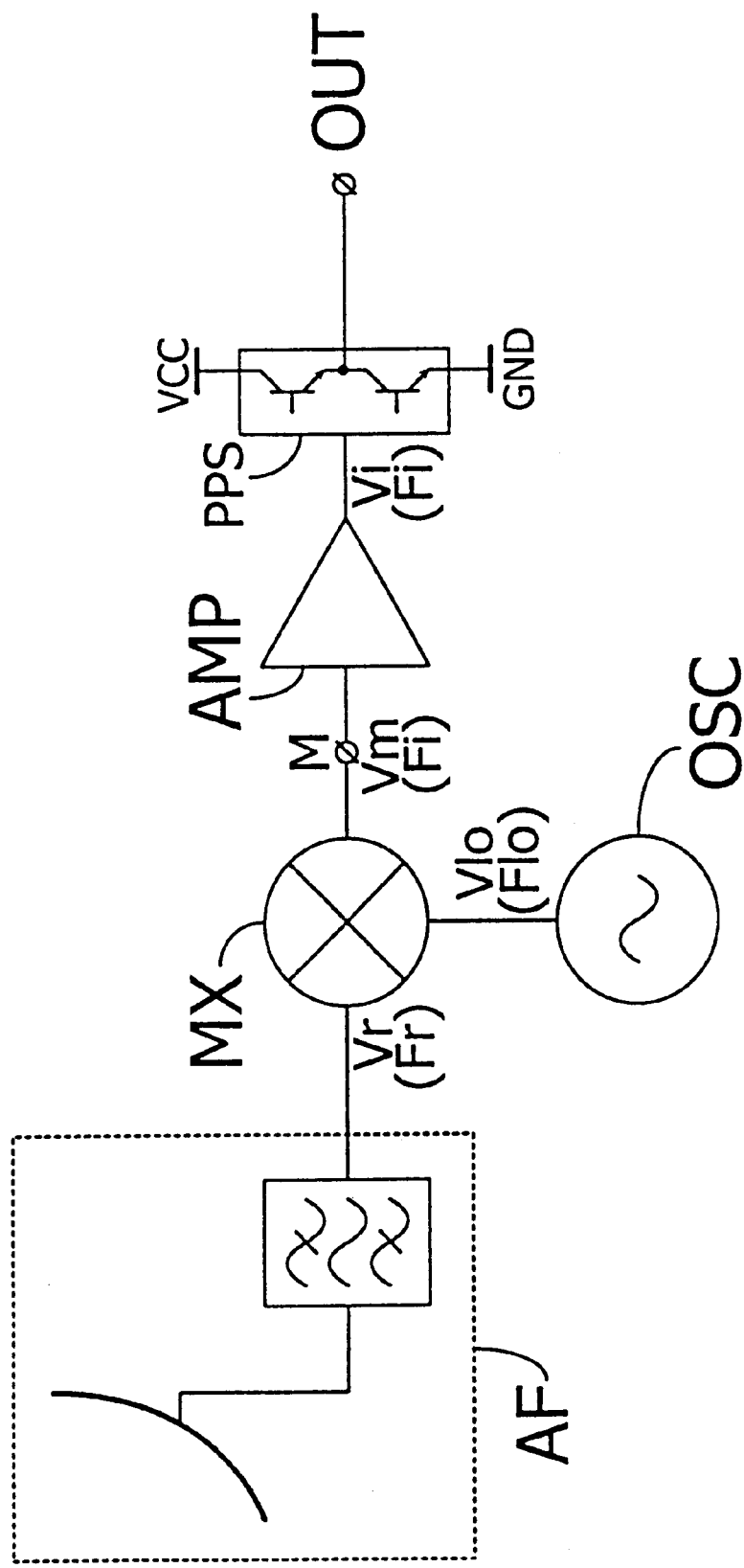
FIG. 1 is a partial functional diagram showing a device for selecting radio electric signals.

FIG. 1 shows diagrammatically a device for selecting radio electric signals, comprising:

an antenna and filtering system AF intended to supply, at an output, an electronic signal Vr having a radio frequency Fr and being representative of the selected radio electric signal, an oscillator OSC intended to supply an output signal Vlo having a tunable oscillation frequency Flo, a mixer MX intended to receive the output signals from the oscillator OSC and the antenna and filtering system AF and to supply, at an output terminal M, an output signal Vm having an predetermined intermediate frequency Fi which is equal to the difference between the radio frequency and the oscillation frequency Fr-Flo, which is currently realized by means of a bandpass filter selecting said intermediate frequency Fi, and an amplifier AMP intended to amplify the output signal of the mixer MX and to supply an output signal Vi resulting from this amplification.

The amplifier AMP is provided with an output stage PPS of the push-pull type constituted by two transistors whose main current paths are arranged in series between a first power supply terminal VCC and a second power supply terminal GND, the junction point between said transistors constituting the output terminal OUT of the selection device.

Figure 2:
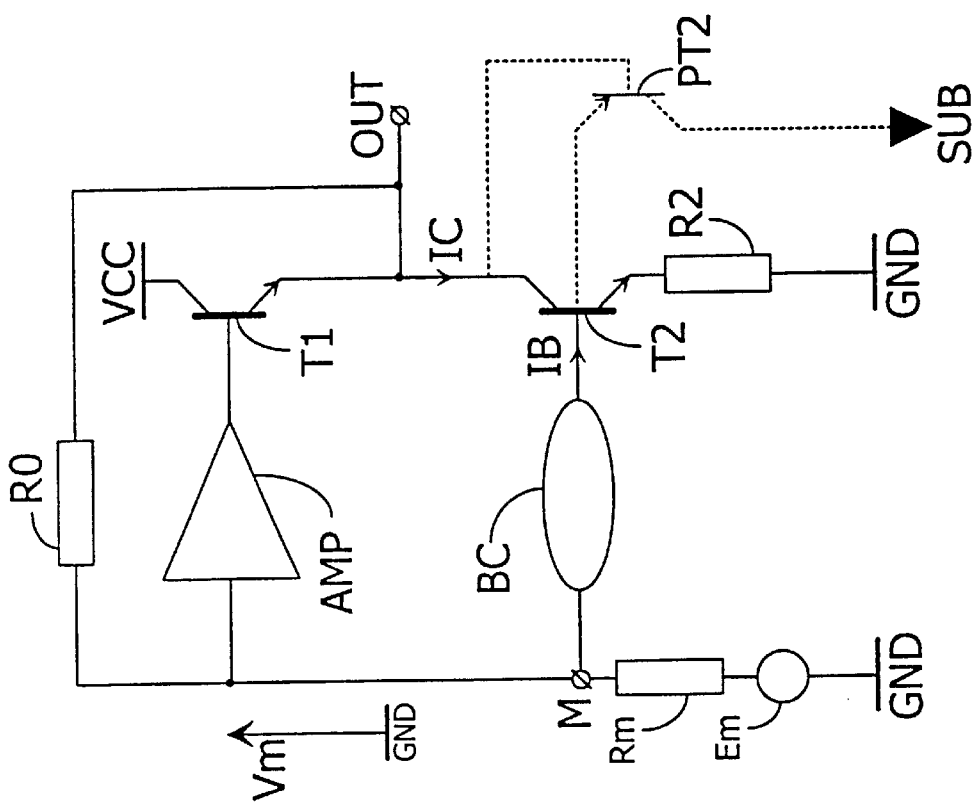
FIG. 2 is a functional diagram showing an amplifier provided with an output stage according to the invention.

FIG. 2 is a functional diagram showing, in more detail, the output stage of the amplifier AMP, and allows better understanding of the technical problem presented by the known output stages. The mixer MX is shown in the form of an equivalent Thévenin generator (Em, Rm) arranged between the output terminal M of the mixer, which also constitutes the input of the amplifier AMP, and the second power supply terminal GND. The output stage comprises a first transistor T1 and a second transistor T2. In the example shown, the first and second transistors T1 and T2 are bipolar transistors of the NPN type whose bases, emitters and collectors constitute bias terminals, reference terminals and transfer terminals, respectively. The first and second transistors T1 and T2 have main current paths defined as the transfer terminal-reference terminal paths constituted, in this example, by their collector-emitter junctions. These main current paths are arranged between a first power supply terminal VCC and a second power supply terminal GND, while a junction point between said current paths constitutes an output terminal OUT of the stage. The base of the first transistor T1 is connected to an output of the amplifier AMP, the base of the second transistor T2 being connected to the input of the amplifier AMP via a bias circuit BC. In this example, a loop resistor RO connects the output terminal OUT of the stage to said input of the amplifier AMP. The function of this loop resistor is to improve the linearity of the amplification performed by the amplifier AMP in accordance with a principle known to those skilled in the art. The main current path of the second transistor T2 is intended for a current IC, while its base receives a bias current IB. When the value of this current becomes sufficiently high, the second transistor T2 leaves its linear operation mode in which the bias current IB is equal to $IC/\beta$, where $\beta$ is the gain of the second transistor, so as to enter into a state of saturation. The second transistor T2 then features a parasitic transistor PT2 having a conductivity type which is opposed to that of the second transistor T2, i.e. of the PNP type in this example, which parasitic transistor PT2 has its base, emitter and collector constituted by the collector, the base and the substrate SUB, respectively, of the second transistor PT2. When the second transistor T2 is saturated, it receives a bias current IB at its base, which bias current is directed towards the substrate SUB via the main current path of the parasitic transistor PT2. If the base of the second transistor T2 has a low impedance, nothing limits the value of the bias current IB, which is precisely the case for known output stages in which the base of the second transistor T2 is connected to the input of the amplifier AMP, whose equivalent impedance is necessarily low, which is a fortiori the case in this example because of the loop resistor RO. If the value of said bias current IB is not limited because of a too low impedance of the base of the second transistor T2, a strong parasitic current IB is injected into the substrate SUB, with the risk of disturbing the operation of all the components included in the selection device integrated on the surface of the substrate SUB, or even causing damage to said device.

Figure 3:
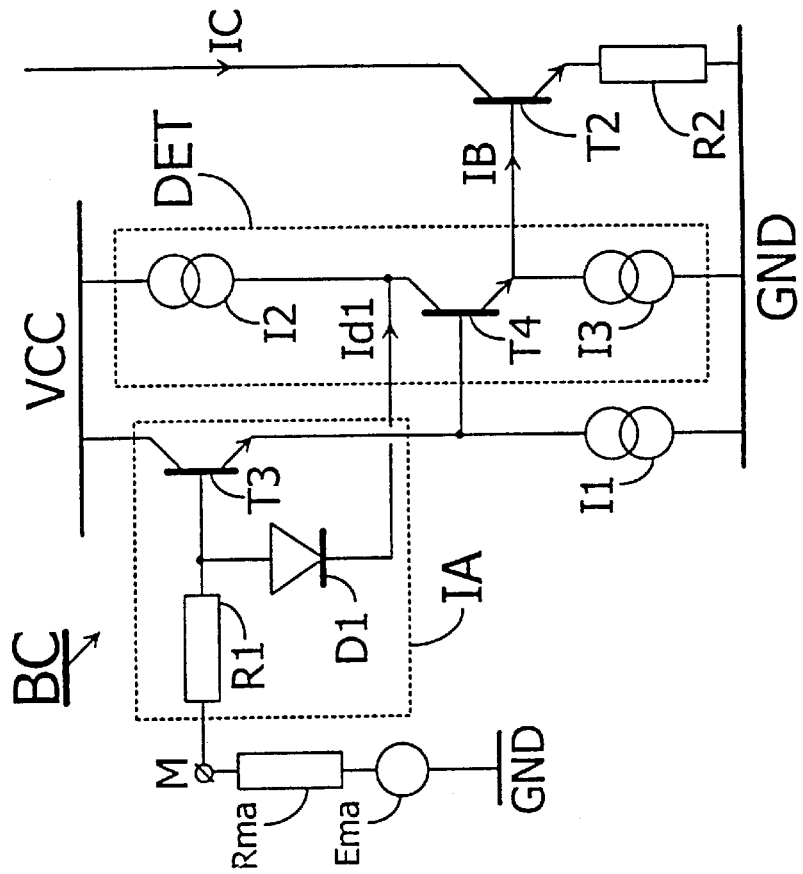
FIG. 3 is an electric circuit diagram showing an output stage in accordance with a preferred embodiment of the invention.

FIG. 3 is an electric circuit diagram showing a bias circuit BC which is present in an output stage in accordance with a preferred embodiment of the invention. This bias circuit BC comprises:

a detection module DET intended to signal the instant when the second transistor T2 enters the saturated state, and an impedance adaptation module IA intended, when activated, to attribute a high impedance to the base of the second transistor T2 when this transistor T2 becomes saturated.

The detection module DET is provided with means for producing a detection current Id1 at an output when the value of the bias current IB of the second transistor T2 exceeds a predetermined threshold, said detection current Id1 being intended to activate the impedance matching module IA.

The impedance matching module IA comprises a third transistor T3, whose base is connected to the input M of the amplifier via a resistor R1, and whose main current path is arranged in series with a first current source I1 between the first and second power supply terminals VCC and GND, the emitter of the third transistor T3 being connected to the base of the second transistor T2 via the detection module DET, the base of the third transistor T3 being connected to the output of the detection module DET via a diode D1. The detection module DET comprises a fourth transistor T4, whose base is connected to the emitter of the third transistor T3, whose collector and emitter are connected to the first and second power supply terminals VCC and GND via second and third current sources I2 and I3, respectively, while the collector of the fourth transistor T4 constitutes the output of the detection module DET, the emitter of said transistor T4 being connected to the base of the second transistor T2.

The generator (Ema, Rma) represents the Thévenin generator which is equivalent to the mixer in parallel with the amplifier, viewed from the input M of said amplifier.

The operation of the bias circuit BC may be described as follows. When the second transistor T2 is in its linear operating mode, i.e. when IB=IC/β, which β is the gain of the second transistor T2, the impedance of the base of said transistor T2 is of the order of tens of Ohms, since being substantially equal to the impedance of the emitter of the fourth transistor T4. The bias current IB is then of the order of hundreds of microamperes. The value of the current supplied by the second current source I2 is chosen in this example to be slightly higher than that of the current supplied by the third current source: I2–I3=ΔI. This difference ΔI constitutes the value of the predetermined threshold above which the bias current IB will be considered to be representative of the instant when the second transistor T2 enters the state of saturation. When, under the effect of an increasing collector current IC, the bias current IB exceeds the value of the predetermined threshold ΔI, the diode D1 becomes conducting so as to supply, at the base of the second transistor T2, the current surplus which the second current source I2 cannot supply. In other words, the detection module DET produces a detection current Id1 which activates the impedance adaptation module IA. Indeed, the diode D1, having become conducting under the effect of the detection current Id1, connects the resistor R1 to the base of the second transistor T2 via the main current path of the fourth transistor T4. The impedance of the base of the second transistor T2 then becomes substantially equal to the resistance R1 which, when chosen to be sufficiently large, enables a limitation of the value of the bias current IB, and thus of the value of the parasitic current injected into the substrate. In the known output stages, the value of the parasitic current is of the order of tens of milliamperes. By choosing a value of the order of kilo-Ohms for the resistance R1, and at comparable dimensions of components and power supply voltages, the parasitic current may be limited to a value of the order of milliamperes, which constitutes a reduction by a factor of 10. When the bias current IB decreases to below the value ΔI of the predetermined threshold, the second current source I2 is again able to supply the total amount of bias current IB, and the detection module DET signals, by interruption of the detection current Id1, the instant when the second transistor T2 enters the linear operating mode. The diode D1 is then blocked and the impedance adaptation module IA is deactivated. The impedance adaptation module IA thus as no significant influence on the operation of the bias circuit BC when the second transistor T2 is in its linear operating mode.

It should be noted that, though in the above-described embodiment, the transistors in the output stage are bipolar transistors, in other embodiments field effect transistors may be used, whose gates, drains and sources will then constitute the bias, transfer and reference terminals.

What is claimed is:

1. An amplifier output stage comprising a first and a second transistor each provided with a bias terminal, a reference terminal and a transfer terminal, said transistors having their main current paths arranged between a first and a second power supply terminal, a junction point between said current paths constituting an output terminal of the stage, the bias terminal of the first transistor being connected to an output of the amplifier, and the bias terminal of the second transistor being connected to an input of the amplifier via a bias circuit, characterized in that the bias circuit includes means for limiting a bias current only when the second transistor is saturated, which comprises:

a detection module for providing an electrical signal at the instant when the second transistor enters the state of saturation, and an impedance matching module including at least one transistor for generating a high impedance at the bias terminal of the second transistor only when said transistor becomes saturated.

2. An output stage as claimed in claim 1, characterized in that the detection module is provided with means for producing a detection current at an output when the value of the current at the bias terminal of the second transistor exceeds a predetermined threshold, said detection current being intended to activate the impedance matching module.

3. An output stage as claimed in claim 2, characterized in that the impedance matching module comprises a third transistor, whose bias terminal is connected to the input of the amplifier via a resistor, and whose main current path is arranged in series with a first current source between the first and second power supply terminals, the reference terminal of the third transistor being connected to the bias terminal of the second transistor via the detection module, the bias terminal of the third transistor being further connected to the output of the detection module via a diode.

4. An output stage as claimed in claim 3, characterized in that the detection module comprises a fourth transistor, whose bias terminal is connected to the reference terminal of the third transistor, and whose transfer and reference terminals are connected to the first and second power supply terminals via second and third current sources, respectively, the transfer terminal of the fourth transistor constituting the output of the detection module, the reference terminal of said transistor being connected to the bias terminal of the second transistor.

5. A device for selecting radio electric signals, comprising:

an antenna and filtering system intended to supply, at an output, an electronic signal having a radio frequency and being representative of the selected radio electric signal, an oscillator intended to supply an output signal having a tunable oscillation frequency, a mixer intended to receive the output signals from the oscillator and the antenna and filtering system, and to supply an output signal having an intermediate frequency equal to the difference between the radio frequency and the oscillation frequency, and an amplifier intended to amplify the output signal of the mixer, characterized in that the amplifier is provided with an output stage as claimed in claim 1.

* * * * *